United States Patent
Sekiya et al.

(10) Patent No.: US 6,316,171 B1
(45) Date of Patent: Nov. 13, 2001

(54) AQUEOUS DEVELOPER FOR LITHOGRAPHIC PRINTING PLATES

(75) Inventors: Toshiyuka Sekiya, Tilburg; Ronald Wiegers, 's-Hertogenbosch; Yuzo Toda, Goirle, all of (NL)

(73) Assignee: Fuji Photo Film B.V., Tilburg (NL)

( * ) Notice: Subject to any disclaimer, the term of this patent is extended or adjusted under 35 U.S.C. 154(b) by 0 days.

(21) Appl. No.: 09/687,561

(22) Filed: Oct. 13, 2000

(30) Foreign Application Priority Data

Oct. 11, 1999 (EP) .................................................. 99203318

(51) Int. Cl.[7] ....................................................... G03F 7/32
(52) U.S. Cl. ......................... 430/331; 430/404; 430/466
(58) Field of Search ..................................... 430/331, 404, 430/466

(56) References Cited

FOREIGN PATENT DOCUMENTS

| | | |
|---|---|---|
| 3800359 A1 | 8/1988 | (DE) . |
| 0004014 | 2/1979 | (EP) . |
| 0323836 | 1/1989 | (EP) . |
| 0923001 A1 | 12/1998 | (EP) . |

*Primary Examiner*—Hoa Van Le
(74) *Attorney, Agent, or Firm*—Merchant & Gould P.C.

(57) ABSTRACT

The invention is directed to an aqueous developing composition which is useful in developing negative-working lithographic printing plates. More particularly, the developing composition includes an organic solvent, a surfactant, and a gelatin, which is present as more than 3% by weight of the total developer.

19 Claims, No Drawings

AQUEOUS DEVELOPER FOR LITHOGRAPHIC PRINTING PLATES

FIELD OF THE INVENTION

This invention relates generally to the field of lithography, and more particularly to an aqueous developer for lithographic printing plates. More specifically, this invention relates to a novel aqueous developer for removing the non-image area of negative lithographic printing plates.

BACKGROUND OF THE INVENTION

In lithographic printing plates, oleophilic image areas materially corresponding to an image and hydrophilic non-image areas are formed in the same plane. The oleophilic image area is ink-receptive and water-repellent, the hydrophilic non-image area is ink-repellent and water-receptive. In the printing process, the ink that is adhered to the image areas is transferred to the printing-paper via a rubber blanket, whereas the non-image areas are wetted with water and do not transfer any ink to the paper. Lithographic printing plates are formed by a light-sensitive layer that is coated on a suitable support. The photosensitive layers can be divided into two types:

Positive working layer, in which the unexposed area remains on the plate after development and thus forms the image area Negative working layer, in which the unexposed area is removed in the development process to reveal the non-image area.

Developer compositions are usually water-based systems, because of environmental and safety reasons. In many cases they contain one or more surfactants and an (low amount of) organic solvent. In the U.S. Pat. No. 4,186,006, benzyl alcohol and the sodium salt of t-Butyl-naphtalene sulphonic acid are described for usage in developer as solvent and surfactant respectively.

Because of the nature of the lithographic plate, binders are usually hydrophobic of nature, which poses the problem that they do not readily dissolve in aqueous systems. To overcome this problem, it is possible to incorporate into the binder some acidic side-groups, which yield a water soluble compound when treated with an alkaline liquid. Examples of these systems can be found in U.S. Pat. Nos. 4,631,245 and 4,902,602. These compounds however tend to have a lower sensitivity and less ink receptivity than binders without acidic side-groups. The less materials groups will result in a higher sensitivity and better ink receptivity, but a poorer solubility in a developer.

Binders that do not dissolve into the developer liquid sufficiently, will form coagulates: they will stick together, forming large, insoluble particles. These particles have an affinity for parts in the automatic development machine that have a hydrophobic surface: brushes, rubber rollers, tank walls. The insoluble particles will adhere to these parts, accumulate, and in time will redeposit on the non-image area of the printing plate, yielding undesired image formation. It costs a lot of effort to clean the developing machine. So higher frequency of and longer time for cleaning will be necessary when that problem remains.

In EP 0004014, a developing composition is described consisting of a water soluble polymer, an anionic surfactant and a water miscible organic solvent, which is characterized by the water soluble polymer being either poly-N-vinyl-N-methylacetamide or polyvinylalcohol. It is further suggested to add 0.01–2 wt % of gelatin. Also in EP 323836, addition of natural polymers including gelatin is mentioned as a thickener. But the effect thereof is insufficient to prevent the problems discussed above.

SUMMARY OF THE INVENTION

The present invention is directed to improving the performance of a developer for binders that are not sufficiently soluble in the developer liquid. This performance improvement is reached by a developing composition which is comprised at least of (a) an organic solvent (b) a surfactant (c) a gelatine, which comprises more than 3% of the total developer weight.

The present invention has the surprising advantage that the binder is dispersed better, the tendency of the binder components to form coagulates is reduced, and the affinity of the binder-particles for brushes, rubber rollers and other hydrophobic parts of the automatic development machine is lowered. This way accumulation of the binder on these parts will occur more slowly or is even prevented, resulting in a low frequency and shorter time for cleaning the development machine and less deposit of developer sludge on the plate

DETAILED DESCRIPTION OF THE PREFERRED EMBODIMENTS

According to the invention, the development solution, which is used for the development of negative lithographic printing plates, preferably contains, next to water, an organic solvent, a surfactant, a gelatine and other agents. The organic solvent is preferably an alcohol and has preferably a boiling point of higher than 120° C. Specific examples of this type of solvent include benzyl alcohol, di-acetone alcohol, 2-methoxy ethanol, 2-ethoxy ethanol, 2-butoxy ethanol, 2-phenoxy ethanol, 1-methoxy-2-propanol, and so on. The preferable amount of these solvents as described here ranges from 1% by weight (b/w) to 7%b/w, more preferably 2%b/w to 5%b/w on the basis of the total weight of developers used.

The surfactant is preferably an anionic surfactant. Specific examples of anionic surface active agents include fatty acid salts such as potassium rhodinate, potassium oleate, sodium stearate etc.; sodium alkylarylsulphonates (e.g. sodium iso-propylnaphtalene sulphonate, sodium salt of dodecyl-p-benzenesulphonate etc.); the salts of sulphates of aliphatic and aromatic alcohols (e.g. sodium salt of lauryl alcohol sulphate, ammonium salt of lauryl alcohol sulphate, sodium salt of oleyl alcohol sulphate, sodium salt of octyl alcohol sulphate, sodium salt of xylenol sulphate etc.), sodium alkyl sulphonates; monosodium salts of N,N-dihydroxyethylglycine; sodium alkylpolyoxythylene sulphates; sodium dialkylsulfosuccinates; etc. The concentration of such anionic surfactant ranges from 0.5 %b/w to 10%b/w, preferably from 2%b/w to 8%b/w, more preferably from 4%b/w to 6%b/w on the basis of the total weight of developers used.

The gelatine consists of gelatine molecules selected from the group consisiting of natural gelatine, alkaline processed gelatine, acid processed gelatine, hydrolysed gelatine, peptised gelatine resulting from enzymatic treatment and recombinant gelatine. It can originate from bovine or porcine matter. The intrinsic viscosity of gelatine, measured as the low-shear (<1/s) viscosity of a 6.67%b/w solution at 40° C., ranges preferably from 3 to 9 mPa.s.

The pH of the developer solution ranges from 4 to 12, preferably from 7 to 11. The pH can be regulated by addition of alkali or acidic agents, e.g. potassium silicate, sodium silicate, potassium hydroxide, sodium hydroxide, lithium hydroxide, sodium tertiary phosphate, sodium secondary phosphate, sodium meta silicate, sodium hydrogen carbonate and other inorganic alkalis, ammonia water and organic amine compounds such as mono-ethanol amine, diethanol amine, triethanol amine for the preparation of alkali developers; by inorganic acids such as hydrochloric acid, sulphuric acid, nitric acid, boric acid; organic acids as citric acid, alkyl-carboxylic acids, (alkyl-)aryl-carboxylic acids, alkyl-sulphonic acids, (alkyl-)arylsulphonic acids and the like.

The invention is further illustrated by, but not restricted to the following examples.

EXAMPLE 1

A special alloy (1S) aluminium sheet of 0.3 mm thickness is subjected to the following surface treatment operations to yield a hydrophilic surface with excellent wear characteristics:

Brush graining with wet pumice slurry

Alkali etching in NaOH solution

Electrolytic graining

Alkali etching

Anodising

Sodium silicate treatment

The thus prepared plates were coated with a solution of the following composition:

| Chemical | g/m$^2$ |
|---|---|
| Polyurethane consisting of 4,4'-diphenylmethane diisocyanate / 1,6-hexamethylene diisocyanate / 2,2-bis(hydroxymethyl)-1-propionic acid / tetra ethyleneglycol (80 / 20 / 20 / 80 mol %, MW = 150000) | 1.01 |
| Dodecylbenzene sulphonic acid salt of the condensate of p-diazo-diphenylamine and paraformaldehyde | 0.15 |
| Phenylphosphonic acid | 0.06 |
| Victoria Pure blue | 0.05 |
| Surfactant | 0.03 |
| 1-Methoxy-2-propanol | 6 |
| Methylethylketone | 8 |
| Methanol | 5 |

The coated plate was dried for 2 minutes at 80° C. The obtained light-sensitive plates were subjected to image wise exposure (a metal-halide mercury vapour lamp (1~5 kW); contact exposure through a negative half tone film, image contribution 20% of the total area; light intensity and exposure time adjusted to yield 3 steps solid on a UGRA offset test-wedge) and then developed in a commercially available automatic development machine, using a developer mixture prepared according to the following recipe:

| Chemical | |
|---|---|
| Benzyl alcohol | 30 g |
| Sodium t-butylnaphthalenesulphonate | 30 g |
| Triethanolamine | 20 g |
| Monoethanolamine | 5 g |
| Gelatine (lime ossein bone gelatine) | 50 g (5%) |
| Water to make | 1000 ml |

Development characteristics were: development temperature 25° C., development time 20 seconds, regeneration 1 l per 25 m$^2$ of plate. Development properties showed no differences compared to a commercially available developer (HD-N1, from Fuji Photo Film Co. Ltd.). No dirt in the processor after the development of 150 m$^2$ was observed.

EXAMPLE 2

On an aluminium plate, prepared in the same way as example 1, a light sensitive composition is coated that has the following composition:

| Chemical | g/m$^2$ |
|---|---|
| 2-Hydroxyethyl methacrylate/acrylonitril/ethyl methacrylate / methacrylic acid co-polymer (copolymerization ratio 45/15/38/2 average molecular weight 120,000) | 1.2 |
| Dodecylbenzene sulphonic acid salt of the condensate of p-diazodiphenylamine and paraformaldehyde | 0.15 |
| Phenylphosphonic acid | 0.06 |
| Victoria Pure blue | 0.05 |
| Surfactant | 0.03 |
| 1-Methoxy-2-propanol | 6 |
| Methylethylketone | 8 |
| Methanol | 5 |

Plates obtained in this fashion were subjected to exposure and development as the plates described in example 1, however this time with a development mixture of the following composition:

| Chemical | |
|---|---|
| 2-Phenoxyethanol | 30 g |
| p-Dodecyl-benzene-sulphonic acid | 30 g |
| Triethanol amine | 20 g |
| Monoethanol amine | 5 g |
| Gelatine (acid pig skin gelatine) | 45 g (4.5%) |
| Water to make | 1000 ml |

Development characteristics: development temperature 25° C., development time 20 seconds, regeneration 1 l per 25 m$^2$ of plate. Development properties showed no differences compared to a commercially available developer (HD-N1, from Fuji Photo Film Co. Ltd.). No dirt in the processor after the development of 150 m$^2$ was observed.

EXAMPLE 3

On an aluminium plate, prepared in the same way as example 1, a light sensitive composition is coated that has the following composition:

| Chemical | g/m$^2$ |
|---|---|
| Copolymer of Vinylbutyral/vinylacetate/vinyllacohol with maleic acid anhydride (71/2/27, acid number 15) | 1.5 |
| Dodecylbenzene sulphonic acid salt of the condensate of p-diazodiphenylamine and paraformaldehyde | 0.4 |
| Victoria Pure Blue | 0.06 |
| Phenyl phosphonic acid | 0.05 |
| Surfactant | 0.03 |
| Methylethylketone | 10 |
| 2-Methoxyethanol | 7 |

Plates obtained in this fashion were subjected to exposure and development as the plates described in example 1, however this time with a development mixture of the following composition:

| Chemical | |
| --- | --- |
| Phenoxy-ethanol | 30 g |
| Sodium t-butylnaphthalene sulphonate | 30 g |
| Potassium silicate | 15 g |
| Gelatine (lime ossein bone gelatine) | 50 g (5%) |
| Water to make | 1000 ml |

Development characteristics: development temperature 25° C, development time 20 seconds, regeneration 1 l per 25 m$^2$ of plate. Development properties showed no differences compared to a commercially available developer (HD-N1, from Fuji Photo Film Co. Ltd.). No dirt in the processor after the development of 130 m$^2$ was observed.

EXAMPLE 4

On an aluminium plate, prepared in the same way as example 1, a light sensitive composition is coated that has the following composition:

| Chemical | g/m$^2$ |
| --- | --- |
| p-toluenesulphonic acid salt of the condensate of p-diazodiphenylamine and paraformaldehyde | 0.045 |
| Actilane SP180 | 0.279 |
| Epikote 3002 | 0.213 |
| Oil Blue 613 | 0.06 |
| Surfactant | 0.004 |
| Phosphoric acid | 0.003 |
| Methylethylketone | 9.13 |
| Methanol | 9.47 |
| Methyllactate | 2.73 |
| 1-methoxy-2-propanol | 2.98 |

The obtained light-sensitive plates were subjected to image wise exposure as in Example 1, and then developed in a commercially available automatic development machine, using a developer mixture prepared according to the following recipe:

| Chemical | |
| --- | --- |
| Sodium dodecylsulphonate | 52.5 g |
| Benzyl alcohol | 30 g |
| Acid Ossein Bone Gelatine (PB Tessenderlo) | 40 g (4%) |
| Triethanol amine | 2.5 g |
| Antischaum (Wacker Chemie) | 0.15 g |
| Water to make | 1000 ml |

Development settings: 30 seconds development time, 30° C. development temperature. The amount of regeneration liquid (same as the developer) was set to 1 l per 10 m$^2$ of plate. The tank content of the developing machine is 5 l. The plates did not show differences in developing properties compared to the plates in the comparative example 1 (see below). After having processed 80 m$^2$ of plate, the development machine was emptied. Inspection of the machine learned that rubber rollers were clean. A few small spots present could easily be removed with a paper tissue. The tank bottom did not show any precipitate, and the layer of developer present in the tank could be rinsed away with hot water (60° C.) without leaving a residue in the tank.

Comparative Example 1

A 1 S aluminium sheet of 0.3 mm thickness is subjected to the same treatment and coating as the plates in example 4. The obtained light-sensitive plates were subjected to image wise exposure as in Example 1, and then developed in a commercially available automatic development machine, using a developer mixture prepared according to the following recipe:

| Chemical | |
| --- | --- |
| Sodium dodecylsulphonate | 52.5 g |
| Benzyl alcohol | 30 g |
| Triethanolamine | 2.5 g |
| Antischaum (Wacker Chemie) | 0.15 g |
| Water to make | 1000 ml |

The conditions for the development of the plates were: 30 seconds development time, 30° C. development temperature. The amount of regeneration liquid (same as the developer) was set to 1 l per 10 m$^2$ of plate. The tank content of the developer machine is 5 l. After having processed 80 m$^2$ of plate, the development machine was emptied. Inspection of the machine learned that rubber rollers were very dirty, and could not easily be cleaned. Furthermore, a layer of precipitate was found on the bottom of the developer tank that could not be rinsed away and needed physical force and strong chemical cleaning agents before removal.

Comparative Example 2

A 1 S aluminium sheet of 0.3 mm thickness is subjected to the same treatment and coating as the plates in example 4. The obtained light-sensitive plates were subjected to image wise exposure as in Example 1 and then developed in a commercially available automatic development machine, using a developer mixture prepared according to the following recipe:

| Chemical | |
| --- | --- |
| Sodium dodecylsulphonate | 52.5 g |
| Benzyl alcohol | 30 g |
| Acid Ossein Bone Gelatine | 20 g (2%) |
| Triethanolamine | 2.5 g |
| Antischaum (Wacker Chemie) | 0.15 g |
| Water to make | 1000 ml |

The conditions for the development of the plates were: 30 seconds development time, 30° C. development temperature. The tank content of the developer machine is 5 l. Again, the amount of regeneration liquid was set to 1 l per 10 m$^2$ of plate. The plates did not show differences in developing properties compared to the plates in comparative example 1, or plates from example 4. After having processed 80 m$^2$ of plate, the development machine was emptied. Inspection of the machine learned that rubber rollers were again very dirty, and could not easily be cleaned. Furthermore, a layer of precipitate was found on the bottom of the developer tank, that could not be rinsed away and needed physical force before removal.

While the invention has been described in connection with a preferred embodiment, it is not intended to limit the scope of the invention to the particular form set forth, but on the contrary, it is intended to cover such alternatives, modifications, and equivalents as may be included within the spirit and scope of the invention as defined by the appended claims.

What is claimed is:

1. An aqueous developing composition which is useful in developing negative-working lithographic printing plates, said composition comprising:
   1. an organic solvent
   2. a surfactant
   3. a gelatine, which comprises more than 3% by weight of the total developer weight.

2. A developing composition as claimed in claim 1 wherein said organic solvent is present in an amount of 1 to 7 by % by weight.

3. A developing composition as claimed in claim 1 wherein said organic solvent is either benzyl alcohol or phenoxyethanol.

4. A developing composition as claimed in claim 1 wherein said surfactant is present in an amount of 0.5% by weight to 10% by weight.

5. A developing composition as claimed in any claim 1 wherein said surfactant is an anionic surfactant.

6. A developing composition as claimed in claim 1 wherein said surfactant is a salt of an alkyl sulphate, an (alkyl-)aryl sulphate, an alkyl sulphonate or an (alkyl-)aryl sulphonate.

7. A developing composition as claimed in claim 1 wherein said gelatine is present in a quantity of 3% by weight to 8% by weight.

8. A developing composition according claim 1, wherein said gelatine consists of gelatine molecules selected from the group consisting of natural gelatine, alkaline processed gelatine, acid processed gelatine, hydrolysed gelatine, peptised gelatine resulting from enzymatic treatment and recombinant gelatine.

9. A developing composition according to claim 1, wherein the intrinsic viscosity of gelatine, measured as the low-shear (<1/s) viscosity of a 6.67%b/w solution at 40° C., is from 3 to 9 mPa.s.

10. A developing composition according to claim 1, wherein the pH is in the range from 4 to 12.

11. A process for the development of a negative-working lithographic printing plate, wherein the said printing plate is developed using a developing composition according to claim 1.

12. A developing composition as claimed in claim 2 wherein said organic solvent is present in an amount of 2 to 5% by weight.

13. A developing composition as claimed in claim 3 wherein said organic solvent is benzyl alcohol.

14. A developing composition as claimed in claim 4 wherein said surfactant is present in an amount of 2% by weight to 8% by weight.

15. A developing composition as claimed in claim 4 wherein said surfactant is present in an amount of 4% by weight to 6% by weight.

16. A developing composition as claimed in claim 7 wherein said gelatine is present in a quantity of 3% by weight to 5% by weight.

17. A developing composition according to claim 10, wherein the pH is in the range from 7 to 11.

18. A developing composition according to claim 6, wherein the alkyl sulphonate is sodium dodecyl sulphonate.

19. A developing composition according to claim 8, wherein the acid processed gelatine is acid ossein bone gelatine.

* * * * *